United States Patent [19]
Marr et al.

[11] Patent Number: 5,742,555
[45] Date of Patent: Apr. 21, 1998

[54] METHOD OF ANTI-FUSE REPAIR

[75] Inventors: Kenneth W. Marr; Shubneesh Batra, both of Boise, Id.

[73] Assignee: Micron Technology, Inc., Boise, Id.

[21] Appl. No.: 700,234

[22] Filed: Aug. 20, 1996

[51] Int. Cl.⁶ .................................................. H01L 21/70
[52] U.S. Cl. .................. 365/225.7; 437/60; 437/922; 437/52; 438/131; 438/467; 438/600; 365/225.7
[58] Field of Search .................. 365/225.7, 189.01, 365/230.01; 437/52, 60, 922; 438/131, 467, 600

[56] References Cited

U.S. PATENT DOCUMENTS

| | | | |
|---|---|---|---|
| 5,057,451 | 10/1991 | McCollum | 437/69 |
| 5,200,652 | 4/1993 | Lee | 307/465 |
| 5,257,222 | 10/1993 | Lee | 365/96 |
| 5,257,225 | 10/1993 | Lee | 365/185 |
| 5,276,653 | 1/1994 | McKenny | 365/225 |
| 5,324,681 | 6/1994 | Lowrey et al. | 437/52 |
| 5,331,196 | 7/1994 | Lowrey et al. | 257/529 |
| 5,412,593 | 5/1995 | Magel et al. | 365/96 |
| 5,506,518 | 4/1996 | Chiang | 326/41 |
| 5,508,220 | 4/1996 | Eltoukhy et al. | 437/60 |
| 5,552,743 | 9/1996 | Manning | 327/567 |

*Primary Examiner*—Viet Q. Nguyen
*Attorney, Agent, or Firm*—Schwegman, Lundberg, Woessner & Kluth, P.A.

[57] ABSTRACT

An integrated circuit anti-fuse is described which is fabricated as a capacitor using a layer of oxide. The two plates of the anti-fuse are coupled to appropriate voltage levels to rupture the oxide and form a conductive short between the plates. One of the plates is formed as a diffused well which is coupled to an external voltage during programming. The well is biased to an internal voltage during normal operation of the circuit incorporating the anti-fuse.

22 Claims, 4 Drawing Sheets

METHOD OF ANTI-FUSE REPAIR

TECHNICAL FIELD OF THE INVENTION

The present invention relates generally to integrated circuits and in particular the present invention relates to a circuit and method of anti-fuse repair.

BACKGROUND OF THE INVENTION

Integrated circuits commonly use programmable elements such as fusible links to allow custom programming of the integrated circuits after fabrication. While fusible links can be used for a variety of applications, they can be particularly useful in replacing defective circuits with redundant circuits. For example, integrated circuit memories are often fabricated with redundant memory cells. These memory cells can be selectively enabled after fabrication to replace defective memory cells which are detected during test operations.

One type of fusible link which could be used is a standard polysilicon fuse. The fuse comprises a polysilicon conductor approximately 0.5μ thick which is fabricated on the integrated circuit such that in its normal state there is a complete electrical path through the fuse. To program the fuse, a high power laser is used to open the electrical path by evaporating a portion of the polysilicon. While effective, the use of polysilicon fuses is limited by physical size requirements. That is, the fuses must be spaced so that neighboring fuses are not damaged when a fuse is opened using a laser. As integrated circuits continue to be fabricated with high density circuitry, the need for more fusible links also increases. The physical spacing requirements of laser fuses, therefore, prohibits their effective use in these high density circuits. Further, polysilicon laser fuses cannot be programmed once the integrated circuit is packaged, or encapsulated in any manner.

Another type of fusible link which has been used in integrated circuits is an anti-fuse. The anti-fuse is electrically opposite of the fuse in that the anti-fuse is a normally open circuit. To program the anti-fuse, its connections are shorted together to form an electrical path through the anti-fuse. One type of anti-fuse which is commonly used in integrated circuits is an oxide-nitride-oxide (ONO) anti-fuse. A typical ONO anti-fuse has a layer of nitride sandwiched between two layers of oxide, where the bottom layer of oxide is in contact with polysilicon and the top layer of oxide is also in contact with polysilicon. The ONO sandwich is a dielectric such that the unprogrammed anti-fuse functions as a capacitor. To program the ONO anti-fuse, a large potential is applied across the dielectric such that the dielectric is ruptured and the two polysilicon layers are shorted together. Although ONO anti-fuses are currently used in DRAMs where they are part of the normal process flow, this may not be true for future DRAMs. Any extra step, such as constructing a capacitor/dielectric structure for use as an anti-fuse, is time consuming and expensive.

For the reasons stated above, and for other reasons stated below which will become apparent to those skilled in the art upon reading and understanding the present specification, there is a need in the art for both an anti-fuse which does not require nitride and a method of programming the anti-fuse which does not result in damage to surrounding circuitry.

SUMMARY OF THE INVENTION

The above mentioned problems with anti-fuses and other problems are addressed by the present invention and which will be understood by reading and studying the following specification. An anti-fuse is described which is fabricated with a layer of oxide and uses an external connection for programming.

In particular, the present invention describes an anti-fuse fabricated in an integrated circuit device comprising first and second conductive plates, and a layer of oxide fabricated between the first and second conductive plates. Anti-fuse logic circuitry is connected to the first plate for selectively coupling the first plate to a program voltage level. A bias circuit is connected to the second plate for coupling the second plate to a bias voltage level. An external connection is connected to the second plate for coupling the second plate to a pre-determined external voltage level during anti-fuse programming.

In an alternate embodiment, an integrated circuit memory is described which comprises an anti-fuse having a layer of oxide fabricated between a polysilicon layer having a dopant polarity and a well formed in a substrate, the well having the same dopant polarity of the polysilicon layer. Program circuitry is connected to the polysilicon layer for providing a program voltage, and an external connection is coupled to the well for providing an external voltage to the well. A bias circuit is connected to the well for coupling the well to a bias voltage.

In yet another embodiment, a method of programming an integrated circuit anti-fuse is described. The anti-fuse comprises a layer of oxide fabricated between two conductive plates. The plates can be fabricated as a polysilicon layer and a well formed in a silicon substrate. The method comprises the steps of coupling the well to a pre-determined negative potential, providing a pre-determined positive potential using programming logic, coupling the polysilicon layer to the pre-determined positive potential, and creating a current path through the layer of oxide to electrically connect the polysilicon layer to the substrate.

Finally, another method of programming an integrated circuit anti-fuse is described. The anti-fuse comprises a layer of oxide fabricated between a polysilicon layer and a well formed in a silicon substrate. The method comprises the steps of coupling the well to a pre-determined positive potential, providing a pre-determined negative potential using programming logic, coupling the polysilicon layer to the pre-determined negative potential, and creating a current path through the layer of oxide to electrically connect the polysilicon layer to the substrate.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
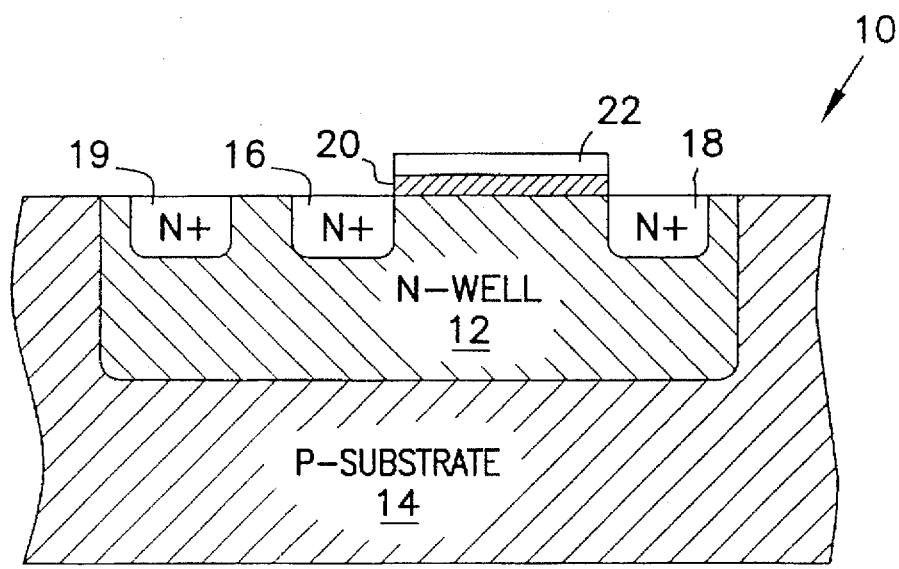
FIG. 1 is a cross section of an anti-fuse of the present invention.
Figure 2:
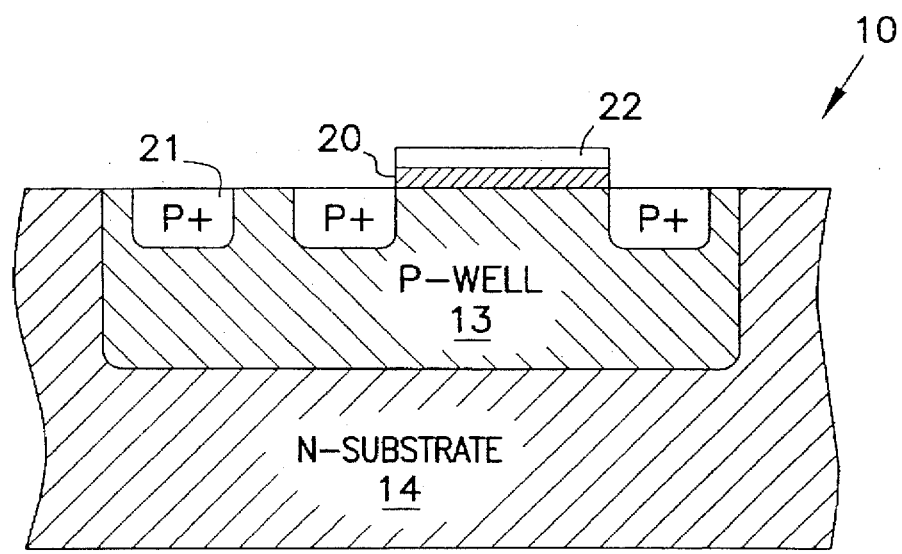
FIG. 2 is a cross section of an alternate anti-fuse of the present invention.

FIG. 1 illustrates one embodiment of an anti-fuse 10 of the present invention. The anti-fuse is fabricated as a gate oxide capacitor using standard transistor fabrication techniques. The capacitor has a layer of n-type polysilicon 22 fabricated on a layer of gate oxide 20, which has been fabricated on an N-well 12 formed in a silicon substrate 14. It will be appreciated that the anti-fuse can also be fabricated as a depletion mode device. The anti-fuse, therefore, has one plate comprising the layer of polysilicon and a second plate comprising the N-well. N+ diffusion regions 16 and 18 (used as source and drain in transistor fabrication) can be used to provide a contact for the second plate of the anti-fuse. Alternatively, an optional well tie diffusion region 19 can be provided as a contact for the second plate. It will be appreciated by those skilled in the art that the anti-fuse can be fabricated as illustrated in FIG. 2 using a p-type polysilicon and a p-well.

Figure 3:
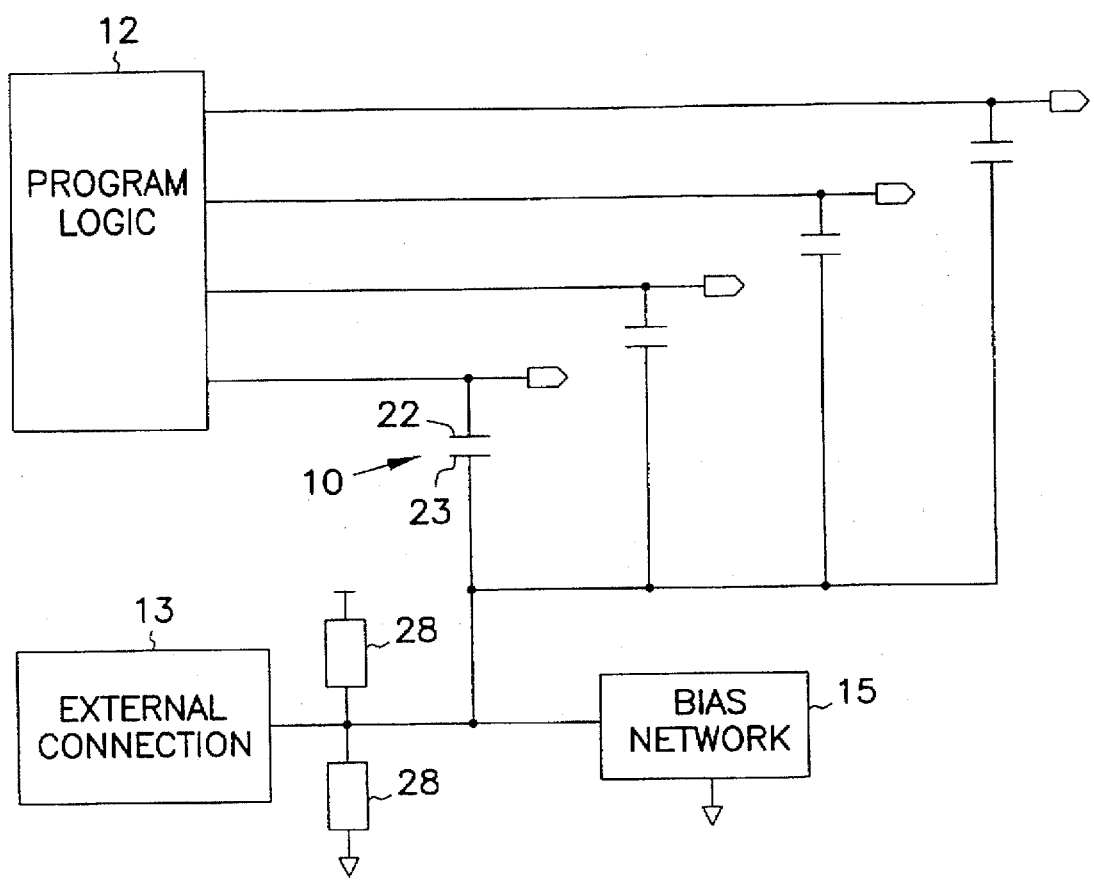
FIG. 3 is a portion of a memory incorporating an anti-fuse of the present invention.
Figure 4A:
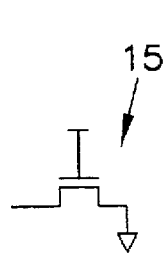
FIG. 4a is a schematic of a bias network of the circuit of FIG. 3.
Figure 4B:
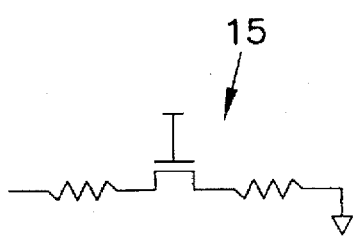
FIG. 4b is a schematic of a bias network of the circuit of FIG. 3.
Figure 4C:
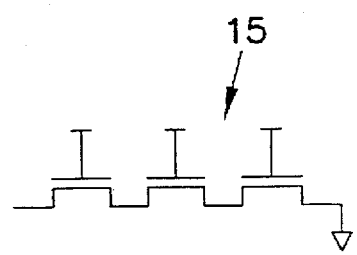
FIG. 4c is a schematic of a bias network of the circuit of FIG. 3.

The anti-fuse can be connected, in a preferred way, as illustrated in the 4 element anti-fuse bank of FIG. 3. A first plate 22 of the anti-fuse can be connected to anti-fuse programming logic 12. The other plate 23 of the anti-fuse is connected to an external contact 13, such as an input pin of an integrated circuit package. The external contact can be connected to a bias network 15. FIGS. 4a, 4b and 4c illustrate alternative bias circuits. The circuit of FIG. 4a comprises a long-L transistor having a drain connected to the external contact and its source connected to ground. FIG. 4b illustrates a long-L transistor having its drain connected to the external contact through a resistor and its source connected to ground (zero potential) through a second resistor. An alternate bias network includes series long-L transistors as illustrated in FIG. 4c. It will be appreciated that any type of transistor or bias circuit can be used without departing from the present invention. Optional electro-static discharge (ESD) circuitry 28 can be provided to protect the circuit from unwanted voltages coupled to the external connection.

To program the anti-fuse a voltage must be applied across the plates of the anti-fuse sufficient to create a current path through the gate oxide layer. This voltage is typically greater than the voltage levels experienced by the integrated circuit during normal operations. The difference between the operating voltage and the break-down voltage insures the integrity of the oxide layer during operation of the integrated circuit. For example, a potential difference across anti-fuse plates of approximately 14 volts is required to break down an anti-fuse having a gate oxide dielectric layer 100Å thick. This potential can be split between plate 22 and the external connection 13, such that the external connection operates as a virtual ground. Therefore, +7 volts can be provided on plate 22 and −7 volts can be provided on connection 13. It will be appreciated that the break-down potential can be provided in any combinations. Thus, plate 22 can be coupled to 0 volts and connection 13 can be coupled to +14 volts.

The method described above can be used with any anti-fuse, and is not limited to anti-fuses having a dielectric layer of gate oxide. Thus, any anti-fuse requiring a predetermined potential for programming can be programmed by coupling one plate to a first potential and a second plate to an external connection having a second potential provided thereon. The sum of the first and second potentials equal the predetermined potential.

In a preferred embodiment, an anti-fuse is programmed by biasing the second plate 23 of the anti-fuse to a positive voltage. The anti-fuse is programmed by selectively grounding the first plate 22 of the anti-fuse using the logic circuit 12. All non-programmed anti-fuse devices are held to a predetermined intermediate voltage which is within the safe operating margin of the anti-fuse. Thus, a full bias voltage appears across the anti-fuse which is to be programmed and only a portion of that voltage appears across un-programmed elements. It will be appreciated by those skilled in the art that circuitry coupled to the anti-fuse must be chosen to withstand the current demands needed to rupture the gate oxide layer.

Once an anti-fuse has been programmed, the bias level is removed from the external connection and the electrically connected first and second plates of the anti-fuse are coupled to ground through the bias network 15. The anti-fuse has been described as fabricated in an n-well using an n-type polysilicon layer. The common n-type to n-type configuration is preferred to eliminate the parasitic diode which would occur after programming the anti-fuse. Rupturing the gate oxide would result in a p-n junction if the silicon doping and polysilicon were different. As stated above, a p-type to p-type anti-fuse can be fabricated using p-type polysilicon.

Figure 5:
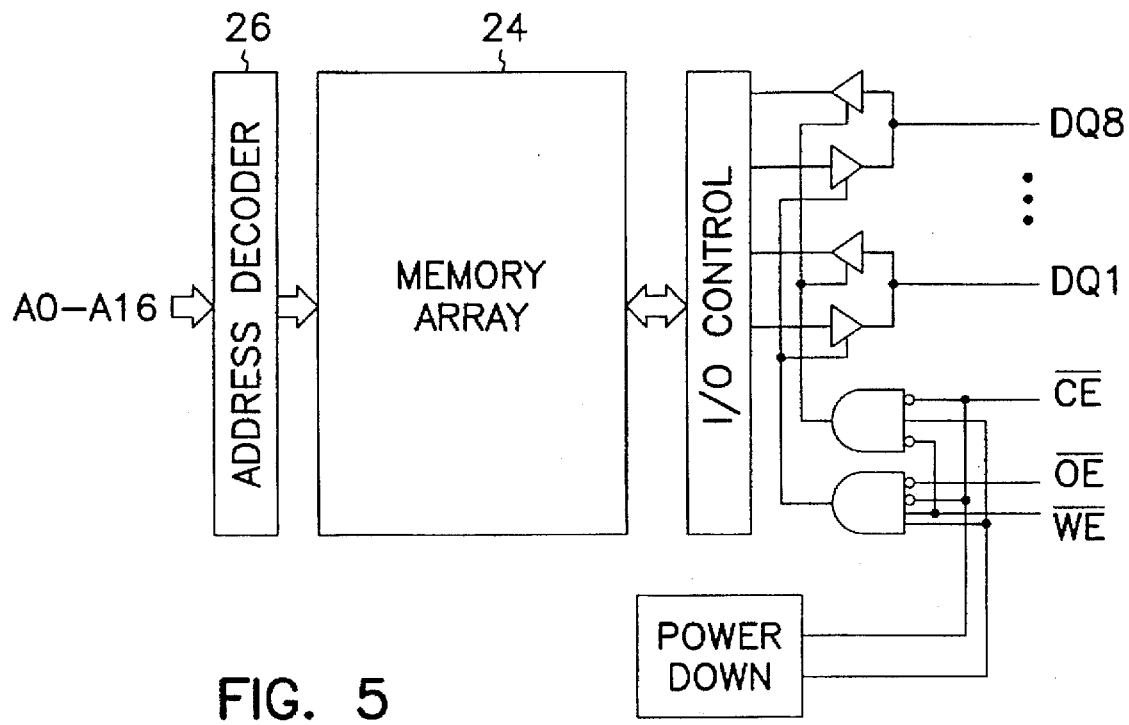
FIG. 5 is a block diagram of a memory incorporating an anti-fuse of the present invention.

The above described anti-fuse can be fabricated in any integrated circuit, including but not limited to memories such as SRAMs and DRAMs, programmable logic devices, PROMs, EPROMs, and EEPROMs. FIG. 5 is a simplified block diagram of a static random access memory device (SRAM) incorporating the present invention. The device is organized as a 128 k×8 SRAM having eight bit data input/output paths labeled DQ1–DQ8 providing data storage for 1,048,576 bits of information in the memory array 24. An address decoder 26 accesses memory cell addresses in response to signals provided on the address inputs (A0–A16). Data is written to the memory when write enable (WE*) and chip enable (CE*) are both low. Data is read from the memory when WE* is high and output enable (OE*) and CE* are both low.

Figure 6:
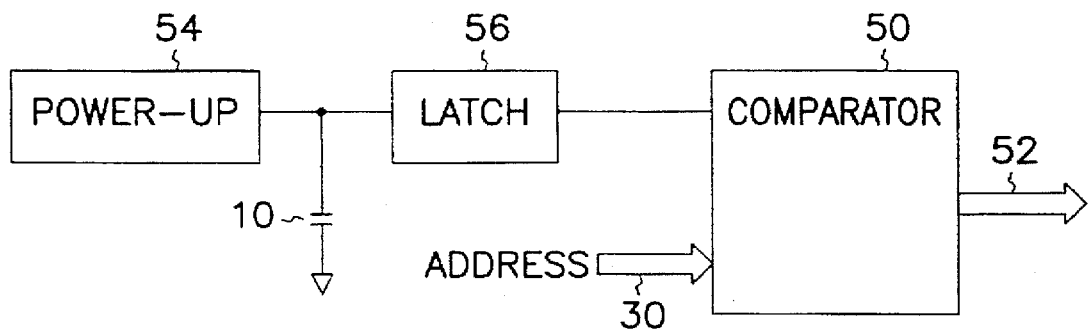
FIG. 6 illustrates a portion of the memory of FIG. 5.

FIG. 6 illustrates a portion of address decoder 26 of FIG. 5 which incorporates anti-fuse 10. The anti-fuses are used to indicate memory cell addresses of memory cells which have been determined to be defective such that redundant memory cells can be used. A compare circuit 50 is provided which compares the external memory addresses 30 to the anti-fuse 10 and produces an appropriate memory cell output address 52. The output address can then be used to access redundant memory cells when appropriate. The anti-fuse is coupled to both a power-up circuit 54 and a latch circuit 56. The power-up circuit is used to read the anti-fuse when the memory is first turned on, and the latch circuit is used to latch the state of the anti-fuse during normal operations. The power-up circuit and latch are merely one method of reading the state of the anti-fuse. Other possible methods include the use of a static circuit such as a load device and static logic detection circuitry. It will be appreciated that the anti-fuse 10 can be incorporated into the memory circuit for any desired purpose and is not limited to redundant memory cell circuitry.

Figure 7:
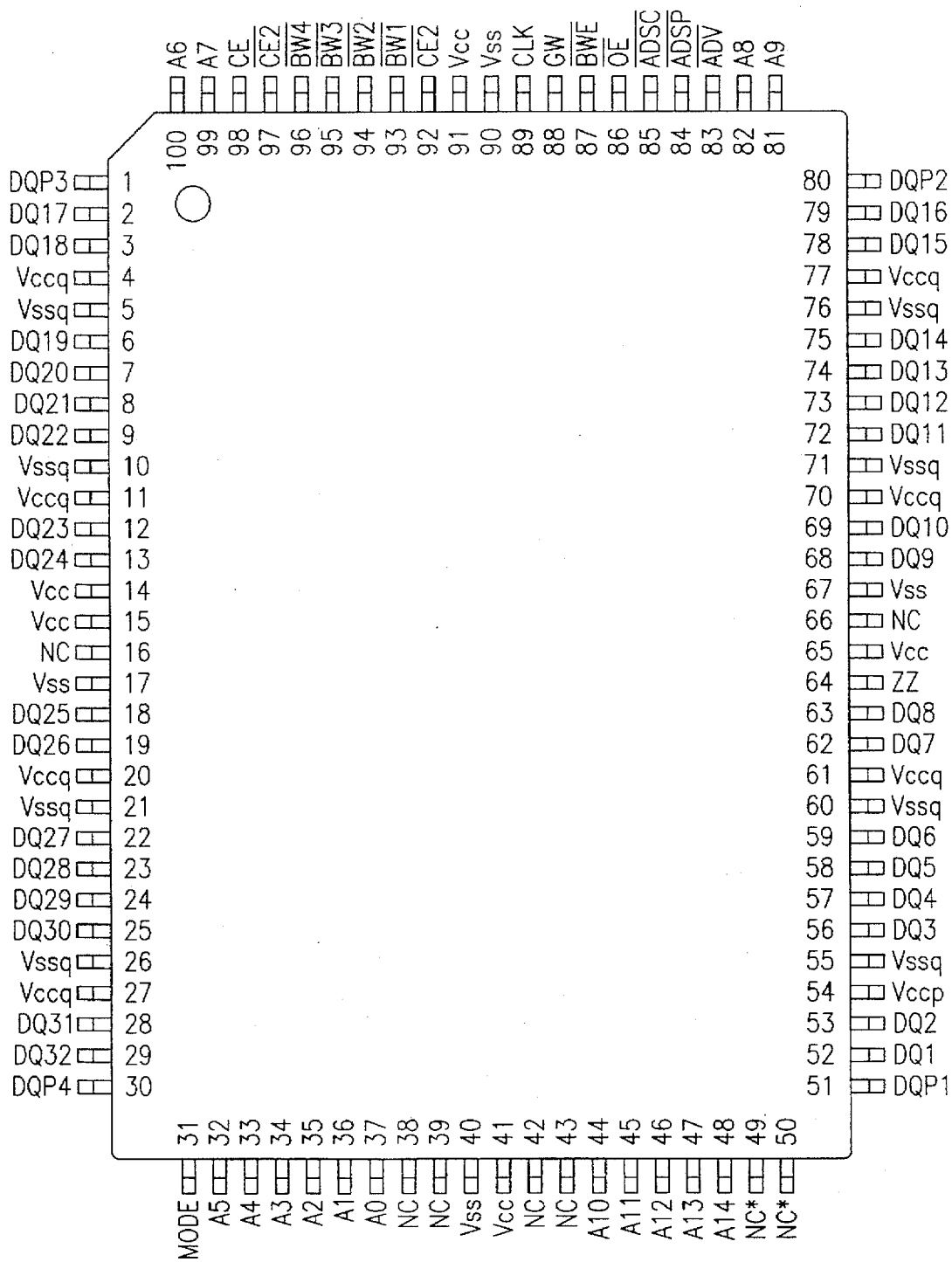
FIG. 7 is an integrated circuit package incorporating the present invention.

FIG. 7 is an integrated circuit package of a 32 k×36 SRAM incorporating the present invention. Pin number 16, 66, 38, 39, 42 or 43 can be used as external connection 13. It will be understood that any size memory can be used and that any non-reserved pin can be used as external connection 13.

Conclusion

An integrated circuit anti-fuse has been described which uses a layer of oxide to isolate the plates of the anti-fuse. One of the plates is fabricated as a well formed in the integrated circuit substrate to electrically isolate the plate from surrounding circuitry during programming. The anti-fuse is programmed by coupling one of the plates to an external connection and coupling the other plate to an internal programming logic circuit. A differential voltage is provided across the anti-fuse plates to rupture the layer of oxide and form a conductive path (short) through the oxide. The voltage provided on the external connection is terminated, and the anti-fuse is biased to a pre-determined voltage during normal operation using a bias circuit, such as a pull down transistor.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   an anti-fuse having first and second plates separated by a layer of dielectric;
   programming circuitry adapted to couple a first potential to the first plate; and
   a virtual ground coupled to the second plate for providing a second potential to the second plate, such that a differential voltage between the first and second plates is sufficient to create a conductive path through the dielectric.

2. An integrated circuit comprising:
   an anti-fuse having first and second conductive plates;
   a layer of oxide fabricated between the first and second conductive plates;
   anti-fuse logic circuitry connected to the first conductive plate for selectively coupling the first conductive plate to a program voltage level; and
   a bias circuit connected to the second conductive plate for coupling the second conductive plate to a ground voltage level;
   an external connection connected to the second conductive plate for coupling the second conductive plate to a pre-determined external voltage level during anti-fuse programming, the pre-determined external voltage level being non-zero.

3. The integrated circuit of claim 2 wherein the first conductive plate is a layer of polysilicon formed on the layer of oxide.

4. The integrated circuit of claim 3 wherein the layer of polysilicon is n-type.

5. The integrated circuit of claim 2 wherein the second conductive plate is a well formed in a silicon substrate.

6. The integrated circuit of claim 5 wherein the well is n-type and the silicon substrate is p-type.

7. The integrated circuit of claim 2 wherein the bias circuit comprises a transistor having a first connection coupled to the second conductive plate and a second connection coupled to the ground voltage.

8. An integrated circuit comprising:
   an anti-fuse having first and second conductive plates;
   a layer of oxide fabricated between the first and second conductive plates;
   anti-fuse logic circuitry connected to the first conductive plate for selectively coupling the first conductive plate to a program voltage level;
   an external connection connected to the second conductive plate for coupling the second conductive plate to a pre-determined external voltage level during anti-fuse programming, the pre-determined external voltage level being non-zero;
   a bias circuit connected to the second conductive plate for coupling the second conductive plate to a bias voltage level; and the bias circuit comprises:
      a transistor having a first connection coupled to the second conductive plate and a second connection coupled to a bias voltage connection to define a current path from the bias voltage connection to the second conductive plate; and
      a resistor located electrically in the current path between the bias voltage connection to the second conductive plate.

9. An integrated circuit comprising:
   an anti-fuse having first and second conductive plates;
   a layer of oxide fabricated between the first and second conductive plates;
   anti-fuse logic circuitry connected to the first conductive plate for selectively coupling the first conductive plate to a program voltage level;
   an external connection connected to the second conductive plate for coupling the second conductive plate to a pre-determined external voltage level during anti-fuse programming, the pre-determined external voltage level being non-zero;
   a bias circuit connected to the second conductive plate for coupling the second conductive plate to a bias voltage level; and
   wherein the bias circuit comprises a plurality of transistors connected in series between the second conductive plate and the bias voltage level.

10. The integrated circuit of claim 2 wherein the integrated circuit device is a memory device.

11. The integrated circuit of claim 10 wherein the memory device is a static random access memory (SRAM) having redundant memory element circuitry.

12. The integrated circuit of claim 2 wherein the program voltage level is zero potential and the external voltage is positive potential.

13. An integrated circuit memory device comprising:
   an anti-fuse comprising a layer of oxide fabricated between an n-type polysilicon layer and an n-well formed in a substrate;
   program circuitry connected to the n-type polysilicon layer for providing a program voltage to the n-type polysilicon layer;
   an external connection coupled to the n-well for providing an external voltage to the n-well; and
   a bias circuit connected to the n-well for coupling the n-well to a ground voltage.

14. The integrated memory circuit of claim 13 wherein the bias circuit comprises a first transistor having a first connection coupled to the n-well and a second connection coupled to the bias voltage.

15. The integrated memory circuit of claim 14 wherein the bias circuit further comprises a second transistor connected between the second connection of the first transistor and the bias voltage.

16. The integrated memory circuit of claim 13 wherein the integrated memory circuit is a static random access memory (SRAM) having redundant memory element circuitry.

17. The integrated memory circuit of claim 13 wherein the program voltage level is zero potential and the external voltage is positive potential.

18. An integrated circuit memory device comprising:

an external connection coupled to an anti-fuse comprising a layer of oxide fabricated between a polysilicon layer and a well formed in a substrate, and a bias circuit connected to the well for coupling the well to a ground voltage; and program circuitry connected to the polysilicon layer for providing a program voltage to the polysilicon layer.

19. A method of programming an integrated circuit anti-fuse, the anti-fuse comprising first and second conductive plates having a layer of oxide fabricated therebetween, the method comprising the steps of:

coupling the first conductive plate to a program voltage;

coupling the second conductive plate to an opposite voltage through an external connection to create a current path through the layer of oxide to electrically connect the first and second conductive layers; and coupling the well to zero potential through a bias circuit.

20. The method of claim 19 wherein the first conductive layer is fabricated as a polysilicon layer, and the second conductive plate is fabricated as a well in a silicon substrate.

21. The method of claim 19 wherein the program voltage is zero potential, and the opposite voltage is a predetermined positive potential.

22. The method of claim 19 wherein the integrated circuit device is a memory.

* * * * *